April 2, 1968 M. W. BYCZKOWSKI 3,376,172

METHOD OF FORMING A SEMICONDUCTOR DEVICE WITH A DEPLETION AREA

Original Filed May 28, 1963

INVENTOR.
MIECZYSLAW W. BYCZKOWSKI

BY Lyon & Lyon

ATTORNEY

United States Patent Office
3,376,172
Patented Apr. 2, 1968

3,376,172

METHOD OF FORMING A SEMICONDUCTOR DEVICE WITH A DEPLETION AREA

Mieczyslaw W. Byczkowski, West Covina, Calif., assignor, by mesne assignments, to Globe-Union Inc., Milwaukee, Wis., a corporation of Delaware Original application May 28, 1963, Ser. No. 283,728. Divided and this application Oct. 22, 1965, Ser. No. 509,468
10 Claims. (Cl. 148—191)

ABSTRACT OF THE DISCLOSURE

A process for passivating the edge of a P-N junction in a semiconductor device by forming an oxide layer over the edge of the junction and then forming a high resistivity conversion layer in the semiconductor under the oxide layer and across the junction.

This application is a division of my application, Ser. No. 283,728, filed May 28, 1963, now abandoned.

The present invention relates to the manufacture of semiconductor units, such as diode regulators and the like; and it relates more particularly to an improved semiconductor unit and to improved processes for fabricating the unit.

An object of the invention is to provide an improved semiconductor diode regulator, or the like, having improved electrical and mechanical characteristics; and to provide improved processes for fabricating the regulator.

Another object of the invention is to provide such an improved regulator of the diffused junction type, in which undesirable surface effects, such as surface leakage, surface breakdown, conversion layer capacitance, and the like, are reduced to a minimum.

Yet another object is to provide an improved manufacturing process for the fabrication of such a diffused junction regulator unit by which undesirable surface effects are minimized, and which enables ohmic electrical contacts to be formed on the regulator in a simple and expeditious manner.

A still further object is to provide such an improved manufacturing process for the fabrication of regulators, or the like, and which results in a regulator construction which permits subsequent packaging and encapsulation techniques to be used for the regulators without affecting their electrical characteristics.

A further object of the invention is to provide such an improved semiconductor regulator, or the like, of the diffused junction type, which exhibits the desired electrical characteristics of high breakdown voltage rating across the junction because surface effects are minimized, and which is further characterized by low and stable reverse current characteristics.

Yet a further object of the invention is to provide such an improved semiconductor unit which may be readily fabricated; to which ohmic electrical contacts may be affixed simply and expeditiously; and which may be encapsulated, or otherwise packaged in an appropriate manner without affecting its electrical characteristics.

According to the present invention, there is provided an improved diffused-junction semiconductor regulator, or the like; and there is also provided an improved manufacturing process by which the diffused junction of the regulator may be passivated. The passivation is achieved by the provision of means including a dense oxide layer across the region of the junction, and a thin electrically stable semiconductor conversion region under the oxide layer.

Further objects and advantages of the invention will become apparent from a consideration of the following description, when the description is taken in conjunction with the accompanying drawings in, which:

FIGURE 1A shows a slice, or substrate, 10 of semiconductor material composed, for example, of silicon. In the illustrated example, and in accordance with the usual prior art practice, the lower region 11 of the crystal is heavily doped with a selected impurity such as boron to provide, for example, P-type conductivity characteristics, this lower region being designated as the $P^+$ region.

The intermediate region 12 of the crystal is relatively lightly doped with the same impurity type to exhibit P-type conductivity characteristics. The intermediate region has relatively high resistivity and is designated the P region.

Figure 1A:
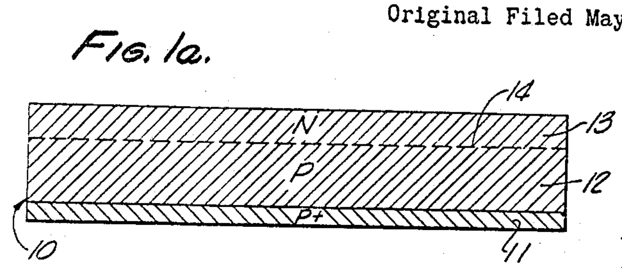
FIGURES 1A–1G illustrate various steps in the fabrication of a semiconductor regulator in accordance with one embodiment of the present invention.

A doping impurity such as phosphorus is diffused into the upper surface of the crystal slice as shown in FIGURE 1A so as to provide a diffused upper region 13 of N-type conductivity characteristics, this latter region having relatively low resistivity and being separated from the intermediate P-type region of the semiconductor slice 10 by a P-N junction 14.

It is to be understood, of course, that although the process of the invention is described with respect to N-diffused P-type material, the principles of the invention are applicable equally to P-diffused N-type material.

The diffused upper N-type region 13 of the semiconductor slice 10 of FIGURE 1A is formed in a manner well understood in the present-day state of the art. The diffusion technique comprises the introduction of a diffusant, such as phosphorous pentoxide ($P_2O_5$), into the semiconductor slice without melting the semiconductor material of the slice to any appreciable extent. This vapor-solid diffusion technique has been found to be advantageous for forming planar broad-area P-N rectifying junctions close to the surface of the silicon slice 10. The resulting structure is particularly useful, for example, for use as a regulator or as a rectifier.

Figure 1E:
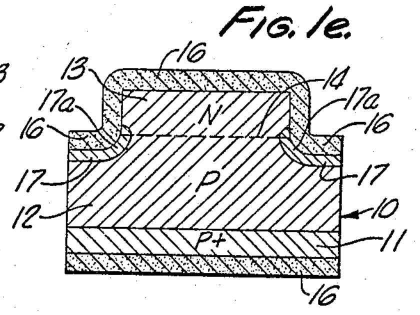
Figure 1B:
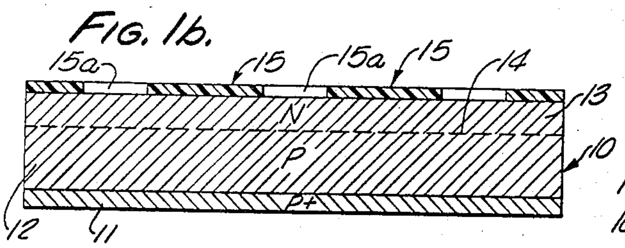

In the step shown in FIGURE 1B, the top surface of the slice 10 is coated with a photo-sensitive resist 15. The resist is developed through an appropriate stencil to form, for example, an annular region 15*a* of undeveloped resist. The unexposed resist in the annular region is washed away, and the exposed resist remains as an acid-resistant coating over the slice 10. The resist may be composed, for example, of a photo-sensitive resist presently being marketed by the Eastman Kodak Co., under the trade name "KMER."

Figure 1F:
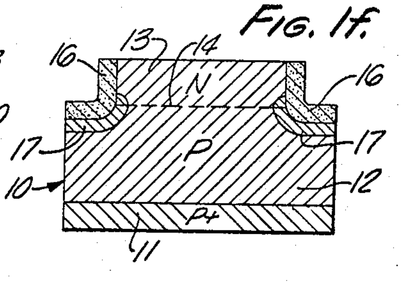
Figure 1C:
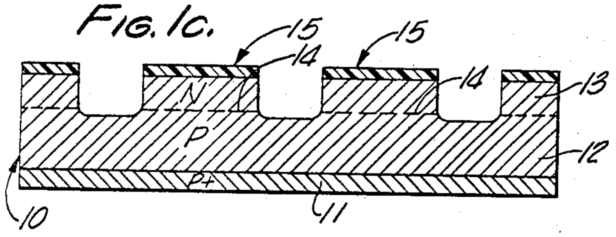
Figure 1G:
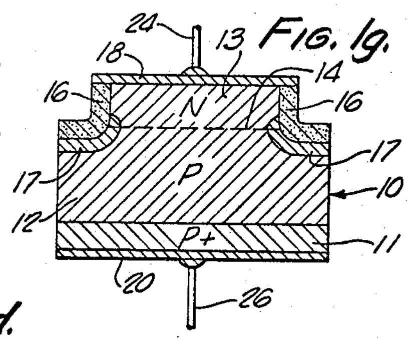

An acid etchant is then applied to the resist-coated top surface of the semiconductor slice 10; and the slice is etched to expose the P-N junction as shown in FIGURE 1C. Any etching technique which provides a reasonably clean surface may be used. For example, the masked top surface of the semiconductor slice 10 may be treated with two parts nitric acid, one part hydrofluoric acid, and one part acetic acid. At the completion of the etching process, the remaining resist is removed, and the assembly is rinsed in running dionized water for about one hour.

Figure 1D:
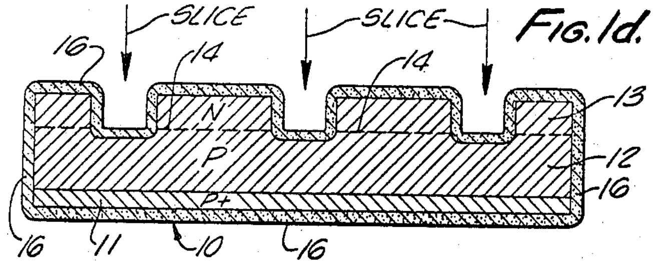
Figure 3:
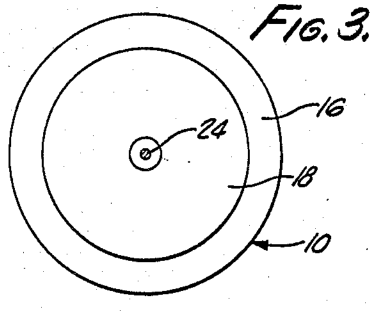
FIGURE 3 is a plan view of a diffused-junction regulator constructed in accordance with the present invention.

A third step of the process, as shown in FIGURE 1D, is to grow a thermal oxide layer 16 over the entire semiconductor slice 10. This is achieved by an appropriate oxidation technique. For example, this oxidation step may be carried out by exposing the semiconductor slice 10 for 1–16 hours, depending upon the particular device, at 1100° C. to wet oxygen; or for a longer interval to dry oxygen at temperatures of 900–1300° C. This layer of silicon dioxide is required in order to form a protective, dense, high-dielectric coating across the etched surface of the annular region of the slice 10 at the exposed P–N junction.

The relatively short exposure interval to wet oxygen is preferred, as will be explained, although such an exposure results in an oxide layer having channels and holes. This porosity of the oxide layer is caused by the fact that the silicon atoms are rapidly and violently pulled out of the semiconductor in order to combine with the oxygen to form an oxide layer of SiO, $SiO_2$, and $Si_2O_4$. If the exposure of the slice is for a longer interval to relatively dry oxygen, the resulting oxide layer is more dense, since it has fewer channels and holes.

In either event, the channels and holes in the oxide coating can be filled up by a subsequent slow oxidation process. This oxidation process uses the oxygen in the silicon, and it is carried out by heating the unit to an elevated temperature in a non-oxidizing atmosphere, or in an atmosphere containing an inert gas, such as helium. This latter heating step could also be carried out in the presence of oxygen, but it would have to be relatively dry oxygen.

Figure 2:
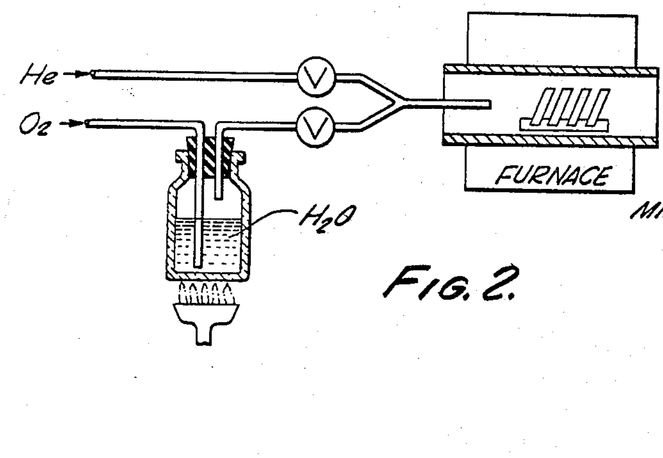
FIGURE 2 is a schematic diagram of a furnace arranged for utilization of the method of the present invention.

The above-described oxidation step is practiced in a particular embodiment of the invention in the following manner: The oxide layer 16 is formed by oxidizing the semiconductor slice 10 for one hour in a furnace with oxygen and steam, and at a temperature of 1100° C. The oxygen is initally passed through deionized water maintained at 75–100° C., as shown in FIGURE 2. After one hour, the the furnace atmosphere is changed to an inert gas such as helium for an additional two hours. The furnace is then turned off, and the semiconductor slice is allowed to cool in the furnace to about 650° C. in the inert gas atmosphere, before being removed from the furnace.

As noted herein above, an object of the invention is to provide a process for passivating the P–N junction of the semiconductor substrate 10. The rectifying junction is passivated when the protective high-dielectric, oxide layer 16 is formed across the surface depletion region of the semiconductor 10 at the exposed P–N junction; and additionally when a high-resistivity, thin conversion layer 17 is formed under the oxide layer 16 across the junction in the semiconductor slice.

The high-resistivity conversion layer 17 may be of the order of 1 micron thick, for example, and it must have a resistivity higher than the resistivity of either the P-type region or the N-type region of the semiconductor, whichever of these latter regions has the higher resistivity. In the particular example under consideration, the resistivity of the conversion layer 17 should preferably be at least ten times higher than the resisitivity of the P-type region.

The manner by which the above-mentioned conversion layer is formed will now be described in conjunction with FIGURE 1E. As shown in FIGURE 1E, the thin conversion layer 17 is formed across the P–N rectifying junction under the protective oxide layer 16.

The conversion layer 17 can be produced either before or during the oxidation step of FIGURE 1D. The conversion layer 17 can be produced, for example, by controlled solid-state diffusion into the semiconductor slice 10, either by intentionally introducing impurities into the depletion region across the exposed P–N junction, in a manner similar to that explained, for example, in Patent 3,040,218 which issued June 19, 1962, in the name of the present inventor; or by the out-diffusion of impurities which are present in the slice.

Out-diffusion refers to the exit of impurities from one surface region of the semiconductor slice 10, and the deposition of the impurities into a different surface region. During the rapid oxidation of the surface of the slice 10 during the step of FIGURE 1D, resistivity changes at the surface of the slice occur distorting the diffused impurity gradient in the semiconductor material. Therefore, when the oxide layer 16 is formed rapidly in the wet oxygen atmosphere, as described above, the resulting rapid oxidation simultaneously provides the conversion layer 17 under the oxide layer.

The out-diffusion step causes the conductivity of region 17*a*, which is the portion of layer 17 on the region 12 side of the P–N junction, as shown in FIGURE 1E, to go from P to $P^-$ to $N^-$ and then to N, if N-type impurities have been gradually added, or from P to $P^+$, if P-type impurities have been added. A post-oxide diffusion step may be used as a means for controlling the out-diffusion in the formation of the high resistivity conversion layer 17. At the completion of the oxidation step of FIGURE 1D, and the simultaneous out-diffusion step, the post-oxide diffusion technique may be used to drive impurities back into the silicon slice 10. This decreases, in a controllable manner, the surface concentration of the out-diffused impurities which occurs during the oxidation and out-diffusion steps, and this post-oxide diffusion step may be continued until the desired characteristics of the high-resistivity conversion layer 17 are achieved. If the region 17*a* were left relatively low-resistivity N type, the device would behave as a current regulator. The described post-oxide diffusion step, which causes region 17*a* to become $N^-$ or $P^-$, results in an excellent voltage regulator or rectifier characteristic without undesired surface leakage or surface breakdown.

The post-oxide diffusion step is carried out at temperature of 1000° C. to 1300° C., depending upon the impurities involved and the impurity gradient, so as to provide a controlled high-resistivity conversion layer 17 at the junction surface. In some instances, the post-oxide diffusion step can be carried out simultaneously with the oxidation step of FIGURE 1D, so that a controlled conversion layer 17 is provided during the oxidation step.

After the formation of the oxide layer 16 and of the conversion layer 17, excess areas of the oxide layer may be removed by a usual lapping operation, as by lapping with fine grit (5 microns or less). The oxide layer may be removed in an alternative of this step by masking all but the contact areas of the slice 10, and then by etching off the exposed oxide with hydrofluoric acid. As shown in FIGURE 1F, the oxide layer 16 is removed from the top of the mesa portion and the bottom of the semiconductor slice 10.

Upon the removal of the oxide layer 16, suitable contacts 18 and 20 may be formed on the top of the mesa portion and on the bottom of the semiconductor slice 10, respectively. The ohmic contacts 18 and 20 are deposited on the contact surfaces by electroless nickel plating, for example, and then by firing the resulting nickel layers at 700° C. for ten minutes in a nitrogen atmosphere. The resulting nickel base layers are then electroplated with nickel and gold, for example, to permit soldering of conductors to the surfaces.

It has been observed that the nickel firing has a gettering effect which improves the reverse current characteristics of the unit. This is because of the gettering by the nickel of fast diffusing impurities, such as gold, which otherwise would have remained in the unit after the oxidation step.

The semiconductor substrate 10 may then be sliced along lines indicated by the arrows in FIGURE 1D, so that the diffused junction regular unit takes on the appearance shown in FIGURES 1E–1G and FIGURE 3. Gold-plated molybdenum electrode discs may then be alloyed to the exposed contact areas 18 and 20, and the resulting units may be formed into standard 1, 10, or 50 watt packages, for subsequent encapsulation in epoxy or glass. Appropriate leads 24 and 26 can be soldered or otherwise attached to the respective electrodes.

As described above, the result is a P–N junction which is passivated, so that it exhibits electrically stable characteristics, characterized by low and stable reverse currents. Also, the bulk breakdown of the junction is preserved by this passivation, by the elimination of surface breakdown. The invention provides, therefore, an improved diffused-junction type voltage regulator, or the like, which may be manufactured easily and conveniently. Moreover, the improved unit of the invention may be encapsulated, or otherwise packaged, without adversely affecting its electrical characteristics.

While a particular embodiment of the unit and process of the invention has been illustrated and described, modifications may be made. It is intended in the following claims to cover all modifications which fall within the scope of the present invention.

I claim:

1. The process of treating a semiconductor member having a first region of a first conductivity type, a second region of a second conductivity type, and a P-N junction disposed between said first and second regions, which process comprises the steps of:

(a) exposing a surface area of said member including at least a portion of the edge of said P-N junction;
(b) forming an oxide layer over said surface area and said portion of said edge of said P-N junction; and
(c) forming across said surface area and said portion of the edge of said P-N junction under said oxide layer, a relatively thin conversion layer of a selected conductivity type and having a relatively high resistivity as compared with said first and second regions.

2. The process of treating a semiconductor silicon member having a first region of P-type conductivity and of relatively high resistivity, a second region of N-type conductivity and of relatively low resistivity, and a P-N junction disposed between said first and second regions, which process comprises the steps of:

(a) etching said semiconductor silicon member to expose a surface area of said member including at least a portion of the edge of said P-N junction;
(b) forming a silicon-oxide layer over said surface area and said portion of the edge of said P-N junction; and
(c) forming a relatively thin $P^-$ conversion layer across said surface area and said portion of the edge of said P-N junction under said oxide layer.

3. The process of treating a silicon semiconductor member having a first region of a first conductivity type, a second region of a second conductivity type, and a P-N rectifying junction formed between said first and second regions, which process comprises the steps of:

(a) masking selected portions of said semiconductor member with an acid-resisting composition;
(b) etching the exposed portions of said semiconductor member with an acid solution to expose a surface area of said member including at least a portion of the edge of said P-N junction;
(c) forming an oxide layer over said surface area and said portion of the edge of said P-N junction; and
(d) forming in said silicon member across said surface area and said portion of the edge of said P-N junction under said oxide layer, a thin conversion layer of a selected conductivity type and having a relatively high resistivity as compared with said first and second regions.

4. The process of treating a silicon semiconductor member having a first region of a first conductivity type, a second region of a second conductivity type, and a P-N rectifying junction formed between said first and second regions, which process comprises the steps of:

(a) etching said semiconductor member to expose a surface area of said member including at least a portion of the edge of said P-N junction;
(b) forming a silicon-oxide layer over said surface area and said portion of the edge of said P-N junction by exposing said member to wet oxygen at an elevated temperature for a selected time interval; and (c) forming in said silicon member across said surface area and said portion of the edge of said P-N junction under said oxide layer, a thin conversion layer of a selected conductivity type and having a relatively high resistivity as compared with said first and second regions.

5. The process defined in claim 4 in which said conversion layer is formed simultaneously with the formation of said oxide layer by an out-diffusion action of impurities in said silicon member, and which includes a post-oxide diffusion step for controllably counter-acting the effects of said out-diffusion action to provide desired conductivity and resistivity characteristics in said conversion layer.

6. The process of treating a semiconductor member having a first region of a first conductivity type, a second region of a second conductivity type and a P-N rectifying junction formed between said first and second regions, which process comprises the steps of:

(a) exposing a surface area of said member including an edge of said P-N junction;
(b) forming an oxide coating over said surface area and said edge of said P-N junction; and
(c) simultaneously forming a high-resistivity thin conversion layer of a selected conductivity type across said surface area and said edge of said P-N junction under said oxide layer by an out-diffusion of impurities in said semiconductor member.

7. The process defined in claim 6 and which includes a post-oxide diffusion step for controllably counteracting the effects of said out-diffusion action to provide desired conductivity and resistivity characteristics in said conversion layer.

8. The process of treating a semiconductor member having a high-resistivity region of a first conductivity type separated from a low-resistivity region of a second conductivity type by a P-N junction, which process comprises the steps of:

(a) exposing a surface area of said member including the edge of said P-N junction;
(b) forming an oxide coating over said surface area and said edge of said P-N junction; and
(c) forming in said silicon member across said surface area and said edge of said P-N junction under said oxide layer, a conversion region less than two microns in thickness and having a resistivity higher than the resistivity of said high resistivity region, said conversion region being formed by an out-diffusion action of impurities in said silicon member, followed by a post-oxide diffusion step for controllably counteracting the effects of said out-diffusion action to provide the desired resistivity in said conversion region.

9. The process of treating a semiconductor member having a high-resistivity region of a first conductivity type separated from a low-resistivity region of a second conductivity type by a P-N junction, which process comprises the steps of:

(a) exposing a surface area of said member including the edge of said P-N junction;
(b) forming an oxide coating over said surface area and said edge of said P-N junction; and
(c) outdiffusing the impurities in said silicon member and then subjecting said member to a post-oxide diffusion for controllably counteracting the effects of said outdiffusion to form in said silicon member across said surface area and said edge of said P-N junction under said oxide layer a $P^-$ conversion region less than two microns in thickness and having a resistivity at least ten times higher than the resistivity of said high-resistivity region.

10. The process of treating a semiconductor member having a high-resistivity region of P-type conductivity separated from a low-resistivity region of N-type conductivity by a P-N junction, the portion of said high-resistivity region which is remote to said P-N junction being a $P^+$ region, which process comprises the steps of:

(a) exposing a surface area of said member including the edge of said P-N junction;

(b) forming an oxide coating over said surface area and said edge of said P-N junction;

(c) outdiffusing the impurities in said silicon member and then subjecting said member to a post-oxide diffusion for controllably counteracting the effects of said outdiffusion to form in said silicon member across said surface area and said edge of said P-N junction under said oxide layer a $P^-$ conversion region less than two microns in thickness and having a resistivity at least ten times higher than the resistivity of said high-resistivity region;

(d) removing the oxide layer from the top surface of said N-type region and from the bottom surface of said $P^+$ region, respectively; and (e) affixing ohmic contacts to said top surface of said N-type region and to the bottom surface of said $P^+$ region, respectively.

References Cited

UNITED STATES PATENTS

| | | | |
|---|---|---|---|
| 2,789,258 | 4/1957 | Smith | 317—235 |
| 2,790,940 | 4/1957 | Prince | 148—186 X |
| 2,930,722 | 3/1960 | Ligenza | 148—1.5 |
| 2,953,486 | 9/1960 | Atalla | 148—191 |
| 3,040,218 | 6/1962 | Byczkowski | 317—235 |
| 3,085,033 | 4/1963 | Handelman | 148—191 |
| 3,122,817 | 3/1964 | Andrus | 148—187 |
| 3,200,019 | 8/1965 | Scott | 148—187 |

HYLAND BIZOT, *Primary Examiner.*